Figure 1:
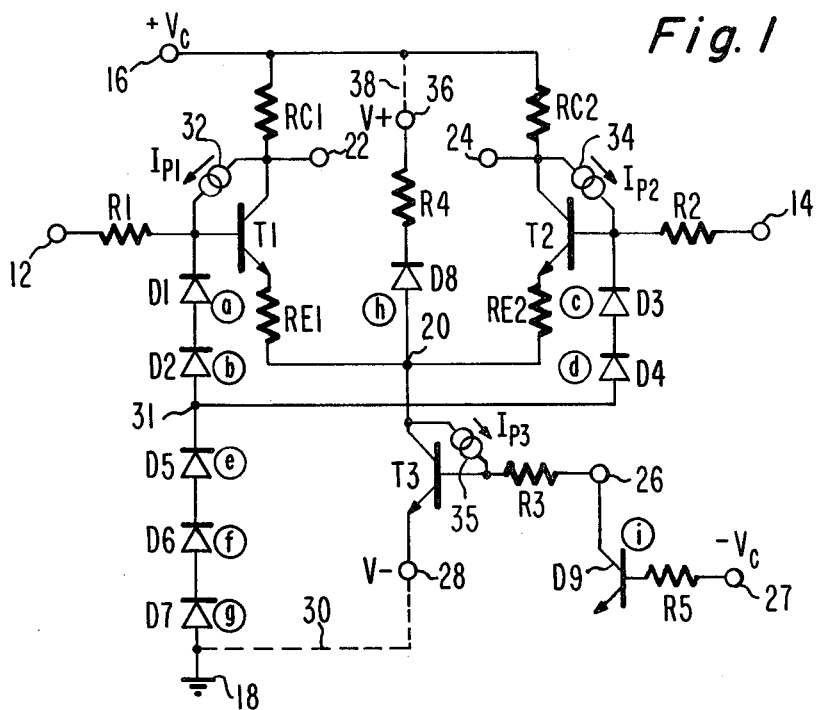

United States Patent [19]

Mazgy

[11] 4,380,741

[45] Apr. 19, 1983

[54] PHOTOCURRENT COMPENSATION FOR ELECTRONIC CIRCUITRY EXPOSED TO IONIZING RADIATION

[75] Inventor: James D. Mazgy, Parsippany, N.J.

[73] Assignee: RCA Corporation, New York, N.Y.

[21] Appl. No.: 205,341

[22] Filed: Nov. 10, 1980

[51] Int. Cl.³ .................... H03F 3/08; H03K 17/00; H03F 17/00

[52] U.S. Cl. ..................... 330/308; 330/59; 307/311

[58] Field of Search ............... 307/308, 311; 330/308, 330/59

[56] References Cited

U.S. PATENT DOCUMENTS

| | | | |
|---|---|---|---|
| 3,409,839 | 11/1968 | Crowe | 330/308 |
| 3,524,999 | 8/1970 | Fletcher et al. | 307/308 |
| 3,716,727 | 7/1973 | Stehlin et al. | 307/243 |
| 3,743,955 | 7/1973 | Stehlin | 330/308 |
| 3,916,332 | 10/1975 | Spence et al. | 330/308 |
| 3,982,197 | 9/1976 | Schade, Jr. | 330/308 |
| 4,013,903 | 3/1977 | Sakamoto et al. | 307/300 |
| 4,118,621 | 10/1978 | Moticelli et al. | 250/214 |
| 4,151,484 | 4/1979 | Robe | 330/308 |
| 4,181,863 | 1/1980 | Parker | 307/311 |
| 4,240,042 | 12/1980 | Robe | 330/302 |

*Primary Examiner*—James B. Mullins
*Assistant Examiner*—Gene Wan
*Attorney, Agent, or Firm*—E. M. Whitacre; P. J. Rasmussen; C. A. Berard, Jr.

[57] ABSTRACT

In one embodiment of the present invention, photocurrents induced in the collector-base junction of a transistor by ionizing radiation incident thereon are compensated by the photocurrent generated by a plurality of series-connected diodes. One feature of the invention includes the selection of the junction areas of the diodes relative to that of the transistor to obtain a predetermined potential at an electrode of the transistor during the incidence of the ionizing radiation.

17 Claims, 2 Drawing Figures

PHOTOCURRENT COMPENSATION FOR ELECTRONIC CIRCUITRY EXPOSED TO IONIZING RADIATION

My invention relates to the compensation of photocurrents induced in a semiconductor junction by ionizing radiation incident thereon and, in particular, to compensation arrangements wherein a predetermined potential is developed at a circuit node when the ionizing radiation is incident.

The problem of compensating photocurrent induced in a semiconductor junction by incident ionizing radiation including, for example, low energy photons, high energy electrons, and gamma radiation, has been long recognized. U.S. Pat. No. 3,409,839 entitled METHOD AND APPARATUS FOR MINIMIZING THE EFFECT OF IONIZING RADIATION ON SEMICONDUCTOR CIRCUITS issued to J. W. Crowe on Nov. 5, 1968, describes the generation of the radiation induced photocurrent as well as an arrangement for the minimization thereof.

Known compensating circuitry, such as that shown by Crowe, however, suffers from one or both of the following problems. First, the connection of a diode to a signal node introduces a capacitance thereat which is detrimental to the high-frequency response of the circuit being compensated. Secondly, the potential at the circuit node to which the compensating circuitry connects can be uncontrolled during the time when the ionizing radiation is incident and immediately thereafter. Such compensating circuitry is therefore unsatisfactory where high-speed of response is required and where a predetermined potential is to be obtained during the incidence of ionizing radiation.

My invention is directed to overcoming both of the aforementioned problems. My invention comprises a transistor, having a semiconductor junction between its collector and base electrodes, the transistor being coupled by load means to an operating supply for receiving an operating potential to condition it for conduction. A photocurrent is induced in the semiconductor junction when ionizing radiation is incident thereon. Compensating means includes a plurality of serially connected semiconductor junctions for generating a compensating photocurrent substantially equal to the induced photocurrent responsive to the incident ionizing radiation. The compensating photocurrent is coupled to one of the collector and base electrodes of the semiconductor junction to flow with polarity sense opposite to that of the induced photocurrent.

Figure 2:
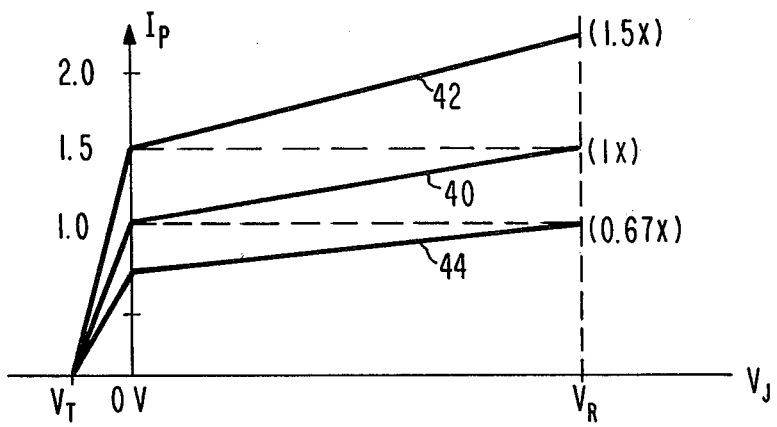

In the drawings:

FIG. 1 is a schematic diagram of an electronic circuit including an embodiment of the present invention; and FIG. 2 is a graph of the photocurrents induced by ionizing radiation.

In the exemplary circuit of FIG. 1, a pair of NPN transistors T1 and T2 are connected in differential amplifier connection. Input signals received at input terminals 12 and 14 are respectively applied to the bases of T1 and T2 via resistors R1 and R2, respectively. The collectors T1 and T2 are respectively coupled to relatively positive operating potential $V_C$ at supply terminal 16 by collector load resistors RC1 and RC2, respectively. The emitters of T1 and T2 are coupled to node 20 by resistors RE1 and RE2, respectively, which are employed for the purpose of controlling the voltage gain of the differential amplifier formed by T1 and T2. Output signals developed across load resistors RC1 and RC2 responsive to input signals applied between terminals 12 and 14 are available at output terminals 22 and 24. Quiescent emitter circuits for T1 and T2 are supplied to node 20 from the collector of transistor T3 which receives biasing potential from terminal 26 via R3. A relatively negative potential V− is applied to the emitter of T3 at terminal 28. One suitable connection of terminal 28 is provided by conductor 30 which connects to reference potential at ground 18. The purpose of D9 and R5 is described below.

Photocurrents are induced in the normally reverse biased collector-base semiconductor junctions of T1, T2, and T3 by ionizing radiation incident thereon. Those photocurrents are represented in FIG. 1 by current generators 32, 34 and 35 respectively generating photocurrents $I_{P1}$, $I_{P2}$ and $I_{P3}$. The photocurrents $I_P$ generated in response to a particular level of ionizing radiation are shown graphically as a function of junction voltage $V_J$ in FIG. 2. Vertical axis $I_P$ represents normalized units of photocurrent and horizontal axis $V_J$ represents the reverse-bias potential across the semiconductor junction. The physical area of the semiconductor junction proportionally affects the level of photocurrent $I_P$ generated and is indicated by the family of parametric curves 40, 42 and 44. Curves 40, 42 and 44 respectively represent semiconductor junctions of reference unit area (1X), of fifty-percent larger junction area (1.5X), and of thirty-three percent smaller junction area (0.67X). Substantially zero photocurrent is generated at a forward bias threshold voltage $V_T$ of the semiconductor junction irrespective of junction area. A 1X area semiconductor junction (see curve 40) generates one unit of current $I_P$ at zero bias condition and generates 1.5 units of current $I_P$ at its rated operating potential $V_R$.

When the compensated junction is series connected with the compensating junctions, substantially equal induced photocurrents will flow therethrough. For this to obtain, their respective junction areas are selected within a range of areas determined by the desired division of the available potential among the semiconductor junctions. Relatively larger portions of the potentials are developed across smaller area junctions and vice versa. Because the 1.5X area semiconductor junction (see curve 42) generates 1.5 units of current $I_P$ at zero bias condition, it is the largest semiconductor junction area that can be employed to compensate a 1X semiconductor junction which develops like current at $V_R$ bias condition. Thus, the combination of 1.5X and 1X area junctions is advantageous when it is desired that the 1X junction have substantially $V_R$ volts thereacross and the 1.5X semiconductor junction have substantially zero volts thereacross, when ionizing radiation is incident thereon. On the other hand, a 0.67X area semiconductor junction (see curve 44) is the smallest junction area that can be employed to compensate a 1X semiconductor junction. Because a 0.67X semiconductor junction generates one unit of current $I_P$ with $V_R$ impressed thereacross, it can compensate a 1X junction which develops like current at zero bias condition. Thus, the combination of 0.67X and 1X area junctions is advantagious when substantially zero volts is to be impressed across the 1X junction and substantially $V_R$ volts is to be impressed across the 0.67X semiconductor junction, when ionizing radiation is incident.

I have discovered that by employing a plurality of semiconductor junctions, such as diodes D1 through D7, to compensate photocurrents $I_{P1}$ and $I_{P2}$, the potentials at the respective bases of T1 and T2 in FIG. 1 can be controlled during the period of time when ionizing radiation is incident and immediately thereafter. Each of the diodes (D1-D9) has a respective junction area represented in FIG. 1 by the encircled letters a through i proximate the diode symbols.

Diodes D1 and D2 are serially connected between the base of T1 and node 31 and are poled so as to be reverse biased and to withdraw from the node at the base of T1 a current of substantially equal magnitude to $I_{P1}$ and flowing in the opposite polarity sense thereto. I.e., the induced photocurrent $I_{P1}$ flows into that node and the compensating photo current in D1-D2 flows out of that node. Serially connected diodes D3 and D4 are coupled between the base of T2 and node 31 and are poled so as to be reverse biased and to withdraw a current from the node at the base of T2 that is substantially equal to photocurrent $I_{P2}$ and flowing in the opposite polarity sense thereto. Node 31 is connected by a current conductive path to a relatively negative potential with respect to that at the bases of T1 and T2, for example, ground 18 potential. A specific example of such current conductive connection comprises diodes D5, D6 and D7 serially connected between node 31 and ground 18 and poled to be normally reversed biased and to withdraw a photocurrent from node 31 that is substantially equal to and flows in the opposite polarity sense to the respective photocurrents conducted by the paths including diodes D1-D2 and D3-D4.

By selection of geometric areas a through g in predetermined relationship to the junction area of the collector-base junction of T1 and that of T2, the division of supply potential $V_C$ across the respective collector-base junctions of T1 and T2 and the semiconductor junctions of diodes D1 through D7 when ionizing radiation is incident can be predetermined. That is so because all the aforementioned semiconductor junctions are interconnected serially so as to carry substantially the same photocurrent. Therefore, the relative potential appearing across each semiconductor junction will be directly related to its respective junction area. As a result the potential at the bases of T1 and T2 will tend to seek a predetermined voltage level when ionizing radiation is incident. Specific junction areas employed in one embodiment including my invention are described below.

Photocurrent $I_{P3}$ generated by the collector-base semiconductor junction of transistor T3, and represented by current generator 35, is compensated by photocurrents generated by diodes D8 and D9. Node 20 is coupled to a relatively positive potential V+ at terminal 36 by the series connection of normally reversed bias diode D8, having junction area h, and resistor R4. Specifically, relatively positive potential $+V_C$ is applied to terminal 36 by, for example, conductor 38 (shown in phantom). Terminal 26 is coupled to relatively negative potential $-V_C$ at terminal 27 through normally reverse biased diode D9 and resistor R5. Diode D9 is shown by way of example as the collector-base junction of an NPN transistor of junction area i.

By selecting the relative junction areas h and i of diodes D8 and D9, respectively, in similar manner to that described above in relation to T1 and T2, the potential at node 20 during the time at which ionizing radiation is incident and immediately thereafter is also be caused to seek a predetermined potential level. This is so because the division of the available potential between the compensated semiconductor junction of T3 and the compensating diodes D8 and D9 is determined in relation to their relative junction areas as described above. The potential at the respective bases of T1 and T2 and at their emitters (node 20) tend to seek respective predetermined levels during incident radiation and immediately thereafter. Therefore, because the input potentials to the T1-T2 differential amplifier tend to seek predetermined levels, it will tend to exhibit a substantially predetermined disturbance at output terminals 22 and 24 caused by the aforesaid ionizing radiation.

I have further found that the above-described photocompensation means may be selected so as not to substantially impair the response of the circuit being compensated to high frequency signals. Because the compensating semiconductor junctions are of relatively similar junction area to that of the semiconductor junction sought to be compensated, they will exhibit a capacitance of relatively similar magnitude. That capacitance can not be substantially reduced by the conventional method of reducing the junction area of the compensating junction consistent with obtaining satisfactory compensation of induced photocurrents. But the series connection of n compensating diodes of similar junction area will exhibit a capacitance that is reduced by a factor 1/n from that of a single such junction. Thus, the capacitance introduced at the node to be compensated can be reduced by any desired degree by merely increasing the number of serially connected photocurrent compensating diodes. So that a substantially similar potential will tend to be developed across those series-connected diodes when ionizing radiation is incident thereon, the area of each such junction is proportionally increased to offset the effect of the aforementioned increased number.

The above described photocurrent compensation is particularly advantageous for integrated circuits constructed by either dielectrically-isolated or silicon-on-sapphire processes. The advantage therein accrues because each of the junctions to be compensated and the compensating junctions are formed during the same process so that their relative junction areas may be precisely controlled in predetermined ratio. By way of reference: dielectrically-isolated integrated circuits are described in M. Fogiel, *Modern Microelectronics*, Section 8.4.3.2, "Dielectric Isolation Techniques," pp. 431-434, 1972; Silicon-on-sapphire integrated circuit technology is described in B. Vonderschmitt, "Silicon-on-Sapphire (SOS): an LSI/VLSI Technology," *RCA Engineer*, June/July 1978, pp. 4-9.

In an embodiment of the circuit of FIG. 1 constructed in a dielectrically-isolated integrated circuit, wherein transistors T1, T2, and T3 are of 1X geometric area, the following relative geometric areas, and component and resistor values, were employed.

| Diode | Relative Geometric Area |
| --- | --- |
| D1, D2, D3, D4 | a through d = 1x |
| D5, D6, D7 | e through g = 2x |
| D8 | h = 1x |

| Resistor | Value |
| --- | --- |
| R1, R2 | 20Ω |
| R3, R4 | 100Ω |
| RC1, RC2 | 2kΩ |
| RE1, RE2 | 100Ω |

In this embodiment, there were three substantially equal area semiconductor junctions between terminal 22 and node 31 and like number between terminal 24 and node 31. Those paths are respectively in series with RC1 and RC2 across supply potential $+V_C$. Three diodes D5–D7 of twice the aforementioned junction area were connected between node 31 and ground 18. Thus, when ionizing radiation is present, each of junctions D1–D4 will conduct one unit of induced photocurrent, D5–D7 will conduct two units thereof, and each of D1–D7 will have approximately one-sixth of $V_C$ (less the potential drop across RC1 or RC2) developed thereacross. Because very high speed response was required, the transistors and diodes therein were of Schottky-Barrier type.

Modifications of the above-described embodiments of my invention described with reference to FIGS. 1 and 2 are contemplated to be within the scope thereof as defined by the following claims. For example, were it desired to reduce the capacitance introduced at node 20 by diode D8, a plurality of series connected diodes could be satisfactorily substituted therefor.

My invention is equally applicable to analog circuits of forms other than that shown in FIG. 1. For example, common-collector, common-base, and common-emitter transistor amplifiers can receive photocurrent compensation in the manner I have described herein.

My invention is also particularly well adapted to be employed in digital or logic circuitry. For example, in a bistable multivibrator, the serially-connected compensating diodes for a first transistor can be of geometric area smaller than that of the first transistor, and the serially-connected compensating diodes for a second transistor can be of larger geometric area than that of the second transistor. Following ionizing radiation being incident thereon, the resulting relatively high predetermined potential at the base of the first transistor will tend to return the first transistor to a highly conductive condition, while the resulting relatively low predetermined potential at the base of the second transistor will tend to return the second transistor to a lesser conductive condition. As a result, the multivibrator will tend to assume a predetermined one of its bistable states (i.e., first transistor ON, second transistor OFF) following the incidence of ionizing radiation thereon.

I claim:

1. In combination:
supply means for receiving an operating potential;
a transistor having base, emitter and collector electrodes, and having a semiconductor junction between its collector and base electrodes;
means including load means for coupling the base, emitter and collector electrodes of said transistor to said supply means to condition said transistor for conduction; and
compensating means for conducting a current substantially equal to a photocurrent induced in the semiconductor junction of said transistor by ionizing radiation incident thereon including:
a plurality of serially connected semiconductor junctions poled for conduction in like direction and responsive to said ionizing radiation for generating a compensating photocurrent substantially equal to said induced photocurrent;
means coupling said supply means to one end of said plurality of serially connected semiconductor junctions to reverse bias said plurality of serially connected semiconductor junctions; and
means for coupling the other end of said plurality of serially connected semiconductor junctions to one of the collector and base electrodes of the semiconductor junction of said transistor to make said compensating photocurrent flow with polarity sense opposite to that of said induced photocurrent.

2. The combination of claim 1 wherein the other of the collector and base electrodes of the semiconductor junction of said transistor is coupled to said supply means at a point of potential of relatively first polarity, and said one end of said plurality of serially connected semiconductor junctions is coupled to said supply means at a point of potential of relatively second polarity opposite to the first.

3. The combination of claim 1 wherein the semiconductor junction of said transistor is of predetermined junction area and wherein each of said plurality of semiconductor junctions is of a respective predetermined junction area selected to develop a predetermined portion of said operating potential across the semiconductor junction of said transistor when said ionizing radiation is incident.

4. The combination of claim 3 wherein the ratio of the junction area of each one of said plurality of semiconductor junctions to the junction area of the semiconductor junction of said transistor is in the range between 0.67 and 1.5.

5. The combination of claim 4 wherein the semiconductor junction of said transistor and each of said plurality of semiconductor junctions are of substantially equal junction area.

6. The combination of claim 1, 2, 3, 4 or 5 wherein said transistor and said plurality of semiconductor junctions are included in an integrated circuit constructed with dielectric isolation regions therebetween.

7. The combination of claim 1, 2, 3, 4 or 5 wherein said transistor and said plurality of semiconductor junctions are included in a silicon-on-sapphire integrated circuit.

8. In an electronic circuit including a transistor having collector and base electrodes and a semiconductor junction therebetween, and having an emitter electrode, and including means for coupling said collector, base and emitter electrodes to respective operating potentials,
improved means for compensating a photocurrent induced in said semiconductor junction by ionizing radiation incident theren comprising:
a plurality of serially connected diode means poled for conduction in like direction and responsive to said ionizing radiation for generating a compensating photocurrent;
means coupling one of said respective operating potentials to one end of said plurality of serially connected diode means to reverse bias said plurality of serially connected diode means; and
means connecting the other end of said plurality of serially connected diode means to one of the collector and base electrodes of said semiconductor junction for making said compensating photocurrent to flow with opposite polarity sense to that of said induced photocurrent.

9. The improvement of claim 8 wherein each of the diode means of said plurality is of predetermined junction area relative to that of the semiconductor junction of said transistor for tending to cause the one electrode of said transistor to seek a predetermined potential level when said ionizing radiation is incident thereon.

10. In combination:

a pair of transistor having respective emitter electrodes connected to a first node, and each having respective collector and base electrodes and respective semiconductor junctions therebetween;

current supply means for supplying emitter current to said first node;

means for applying respective signals to the respective base electrodes of said pair of transistors;

load means to which the respective collector electrodes of said pair of transistors couple for withdrawing respective collector currents therefrom; and means for compensating first and second photocurrents induced in the respective semiconductor junctions of the first and second ones of said pair of transistors by ionizing radiation incident thereon including:

first and second pluralities of diode means for generating respective first and second compensating photocurrents responsive to said incident ionizing radiation, the respective diode means of each of said first and second pluralities of diode means being connected in series and poled for conduction in like direction;

first means for coupling said first plurality of diode means between the base electrode of the first one of said pair of transistors and a second node, said first plurality of diode means being poled for making said first compensating photocurrent of opposite polarity sense to that of said first induced photocurrent;

second means for coupling said second plurality of diode means between the base electrode of the second one of said pair of transistors and said second node, said second plurality of diode means being poled for making said second compensating photocurrent of opposite polarity sense to that of said second induced photocurrent; and current conductive means coupled between said second node and a point of reference potential for conducting said first and second compensating photocurrents thereto.

11. The combination of claim 10 wherein each of said first and second plurality of diode means includes a like number of said diode means.

12. The combination of claim 10 wherein each of the diode means of said first plurality is of predetermined junction area relative to that of the semiconductor junction of the first one of said pair of transistors.

13. The combination of claim 10, 11 or 12 wherein said current conductive means includes means for generating a further photocurrent responsive to said incident ionizing radiation that is substantially equal to and flows in opposite polarity sense to the sum of said first and second compensating photocurrents.

14. The combination of claim 13 wherein said means for generating a further photocurrent includes at least one further diode means poled for conduction in like direction to that of said first and second pluralities of diode means.

15. The combination of claim 14 wherein said further diode means is of predetermined junction area relative to that of the diode means of said first and second pluralities.

16. The combination of claim 15 wherein each of the diode means of said first and second pluralities are of substantially equal first junction area and said further diode means is of second junction area substantially twice said first junction area.

17. The combination of claim 12 wherein each said predetermined junction area is selected for tending to cause the base electrode of said first transistor to seek a predetermined potential level when said ionizing radiation is incident thereon.

* * * * *

UNITED STATES PATENT AND TRADEMARK OFFICE
CERTIFICATE OF CORRECTION

PATENT NO. : 4,380,741

DATED : April 19, 1983

INVENTOR(S) : James D. Mazgy

It is certified that error appears in the above-identified patent and that said Letters Patent is hereby corrected as shown below:

Column 1, immediately below the title, insert
--The Government has rights in this invention pursuant to Subcontract No. A7ZV-522551-F-501 under Contract No. F04701-74-C-0240 awarded by the Department of Air Force.--

Signed and Sealed this

Thirteenth Day of March 1984

[SEAL]

Attest:

GERALD J. MOSSINGHOFF

Attesting Officer

Commissioner of Patents and Trademarks